United States Patent
Tanaka et al.

(10) Patent No.: US 8,279,359 B2
(45) Date of Patent: *Oct. 2, 2012

(54) FLAT PANEL DISPLAY

(75) Inventors: Teppei Tanaka, Yokohama (JP); Yasushi Naito, Yokohama (JP); Yasuhiro Tomita, Odawara (JP); Yoshiharu Yamashita, Yokohama (JP); Yutaka Yamada, Yokohama (JP); Kohei Miyoshi, Fujisawa (JP); Seiichi Sekiguchi, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/442,049

(22) Filed: Apr. 9, 2012

(65) Prior Publication Data

US 2012/0194499 A1    Aug. 2, 2012

Related U.S. Application Data

(63) Continuation of application No. 12/258,521, filed on Oct. 27, 2008, now Pat. No. 8,159,622.

(30) Foreign Application Priority Data

Nov. 7, 2007  (JP) .................................. 2007-289433

(51) Int. Cl.
*H04N 5/64*  (2006.01)

(52) U.S. Cl. ...................................................... 348/836

(58) Field of Classification Search .................. 348/836, 348/837, 838, 839, 840, 841, 842, 843
See application file for complete search history.

(56) References Cited

U.S. PATENT DOCUMENTS

| | | | |
|---|---|---|---|
| 6,946,798 B2 | 9/2005 | Kawaguchi et al. | |
| 7,206,039 B2 | 4/2007 | Kawamoto et al. | |
| 7,440,038 B2 | 10/2008 | Kato | |
| 7,457,120 B2 | 11/2008 | Bae et al. | |
| 7,529,082 B2 | 5/2009 | Maruta | |
| 7,679,931 B2 | 3/2010 | Kim | |
| 2002/0171774 A1 | 11/2002 | Lee | |
| 2006/0279189 A1 | 12/2006 | Jeong | |
| 2007/0200963 A1 | 8/2007 | Shin | |
| 2009/0225239 A1 | 9/2009 | Osada et al. | |
| 2009/0225240 A1 | 9/2009 | Suzuki et al. | |

FOREIGN PATENT DOCUMENTS

| | | |
|---|---|---|
| JP | 2000-156581 | 6/2000 |
| JP | 2006-337982 | 12/2006 |
| JP | 2007-065302 | 3/2007 |
| JP | 2007-108488 | 4/2007 |
| JP | 2007-134825 | 5/2007 |

*Primary Examiner* — Jeanette E Chapman
*Assistant Examiner* — James Buckle, Jr.
(74) *Attorney, Agent, or Firm* — Antonelli, Terry, Stout & Kraus, LLP.

(57) ABSTRACT

A flat panel display apparatus includes a plasma display panel, a power supply substrate, a signal processing substrate, a Y sustaining substrate, and an X sustaining substrate. The power supply substrate, the signal processing substrate, the Y sustaining substrate and the X sustaining substrate are arranged at a back of the plasma display panel. When viewing the plasma display panel from the back, the power supply substrate is arranged at a center portion of the plasma display panel, the Y sustaining substrate is arranged at one of a left and right side of the plasma display panel, the X sustaining substrate is arranged at the other of the left and right side, and the signal processing substrate is arranged under the X sustaining substrate. A circuit substrate other than the power supply substrate, the Y sustaining substrate, and the X sustaining substrate is arranged under the power supply substrate.

7 Claims, 10 Drawing Sheets

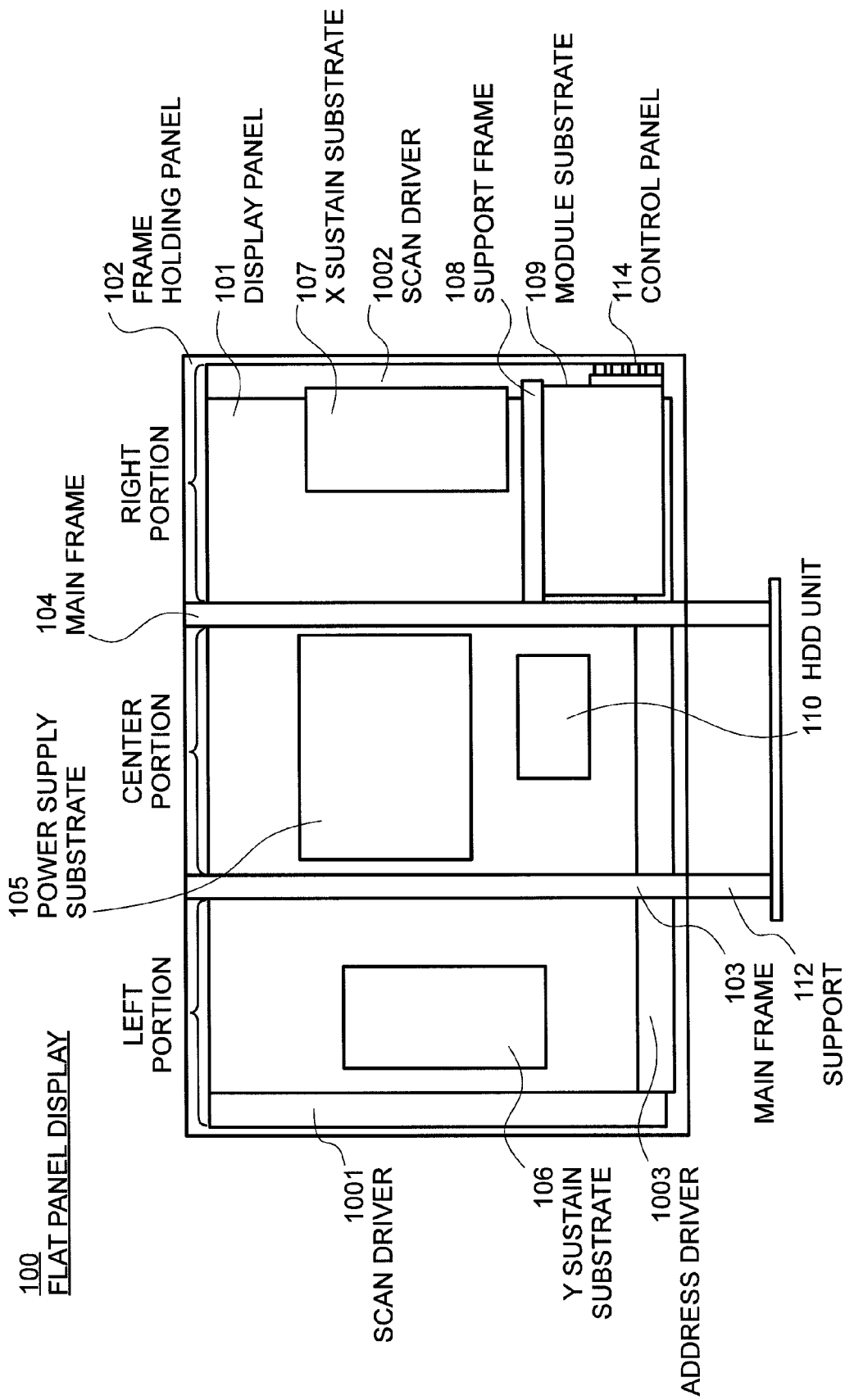

FLAT PANEL DISPLAY

CROSS REFERENCE TO RELATED APPLICATION

This application is a continuation of U.S. application Ser. No. 12/258,521, filed Oct. 27, 2008, now U.S. Pat. No. 8,159,622, the contents of which are incorporated herein by reference.

BACKGROUND OF THE INVENTION (1) Field of the Invention

The present invention relates to a flat panel display using a display device such as a plasma display panel, and in particular, to a technique for improving heat radiation.

(2) Description of the Related Art

A conventional flat panel display using a display device such as a plasma display panel (PDP) generally displays an image on the front side of the display device (hereinafter referred to as a "display panel") and mounts a large number of electronic mechanical components on the rear side thereof. For this reason, a user who watches an image views the screen of the panel from the front side thereof.

The flat panel display using the PDP arranges a power supply substrate, a Y sustaining substrate, an X sustaining substrate, a signal processing circuit, an operation substrate and an external input and output substrate on a face opposite to the screen of the panel, i.e., on the rear side thereof and each component is fixed with a holding member incorporating the PDP. The substrates are connected together with cables and power supply plugs are also connected together with cables. The entire components are covered with a protective cover to construct the flat panel display.

The flat panel display using a display device such as the PDP becomes larger and thinner in a display screen in recent years.

As described in Japanese Patent Application Laid-Open No. 2000-156581, space is decreased in the direction of thickness on the side of the substrates mounted on the rear side to adapt requirement for thinning, most flat panel displays forcibly radiate heat with a fan. However, driving the fan raises heating value, and at the same time, increasing the flat panel display in size also increases heating value and thinning the display decreases a channel for radiating heat. Merely radiating heat with a fan is insufficient at present.

If a substrate is dispersed and a cable is long, a relay amplifier is required. A magnetic field generated by current flowing temporally varies current itself and increases a current value to require a driving circuit with a larger driving force, further increasing consumption current.

In the panel display using the PDP, the panel generates a large amount of electromagnetic waves so that it is highly necessary to be electromagnetically shielded.

SUMMARY OF THE INVENTION

The present invention provides a flat panel display having fewer heat radiating fans to ensure a channel for causing a heat radiating air to flow.

More specifically, in a flat panel display according to the present invention, a flat panel display, comprising,
a display panel and an electronic circuit device, which is mounted on a back side surface of said display panel, wherein said electronic circuit device is constructed four (4) sets of module substrates, each having a different heating value, and the back side surface of said display panel is divided into a center portion, a left portion and a right portion, wherein one of said module substrates having the highest heating value is arranged in said center portion, while other module substrates having the heating values lower than the highest one of are arranged at least one of said left portion and said right portion.

Furthermore, in the flat panel display according to the present invention, the substrate which is the greatest in heating value is rendered a power supply substrate, the substrate which is the second greatest in heating value is rendered a Y sustaining substrate and the substrate which is the third greatest in heating value is rendered an X sustaining substrate. Further, the substrate which is the smallest in heating value mainly includes a signal processing circuit and other substrates.

Still furthermore, the flat panel display according to the present invention includes: a display panel; a power supply substrate arranged at the back of the display panel and constructing a power supply for operating the display panel; and a signal processing substrate arranged at the back of the display panel and processing a video signal displayed on the display panel; wherein the power supply substrate is arranged at the center portion of the display panel, the signal processing substrate is arranged at one of the left and the right in the horizontal direction of the display panel and in a position where the signal processing substrate does not overlap with the power supply substrate in the vertical direction of the display panel.

Still furthermore, in the flat panel display according to the present invention, openings for heat radiation are made at the center of the arrangement and at the upper and the lower portion of a cover of the flat panel display to enable air to be circulated.

According to the present invention, heat can be effectively radiated even in a flat panel display whose consumption power increased due to increase in its size. Furthermore, heat can be effectively radiated even in a flat panel display whose structure hardly employs a heat radiating channel because the display is thinned.

As a second advantage of the present invention, the signal processing circuit and other substrates are incorporated into the same substrate, so that cable wirings between the substrates are shortened or laid on the substrate, which decreases the number and the length of cable wirings. This increases available space to easily secure channels for heat radiation. In addition, electromagnetic induction can be less generated to allow reduction in consumption power and improvement in functions of the display device.

BRIEF DESCRIPTION OF THE DRAWINGS

FIG. 10 is a rear view of one embodiment of a flat panel display according to the present invention.

DETAILED DESCRIPTION OF THE ILLUSTRATED EMBODIMENT

Figure 1:
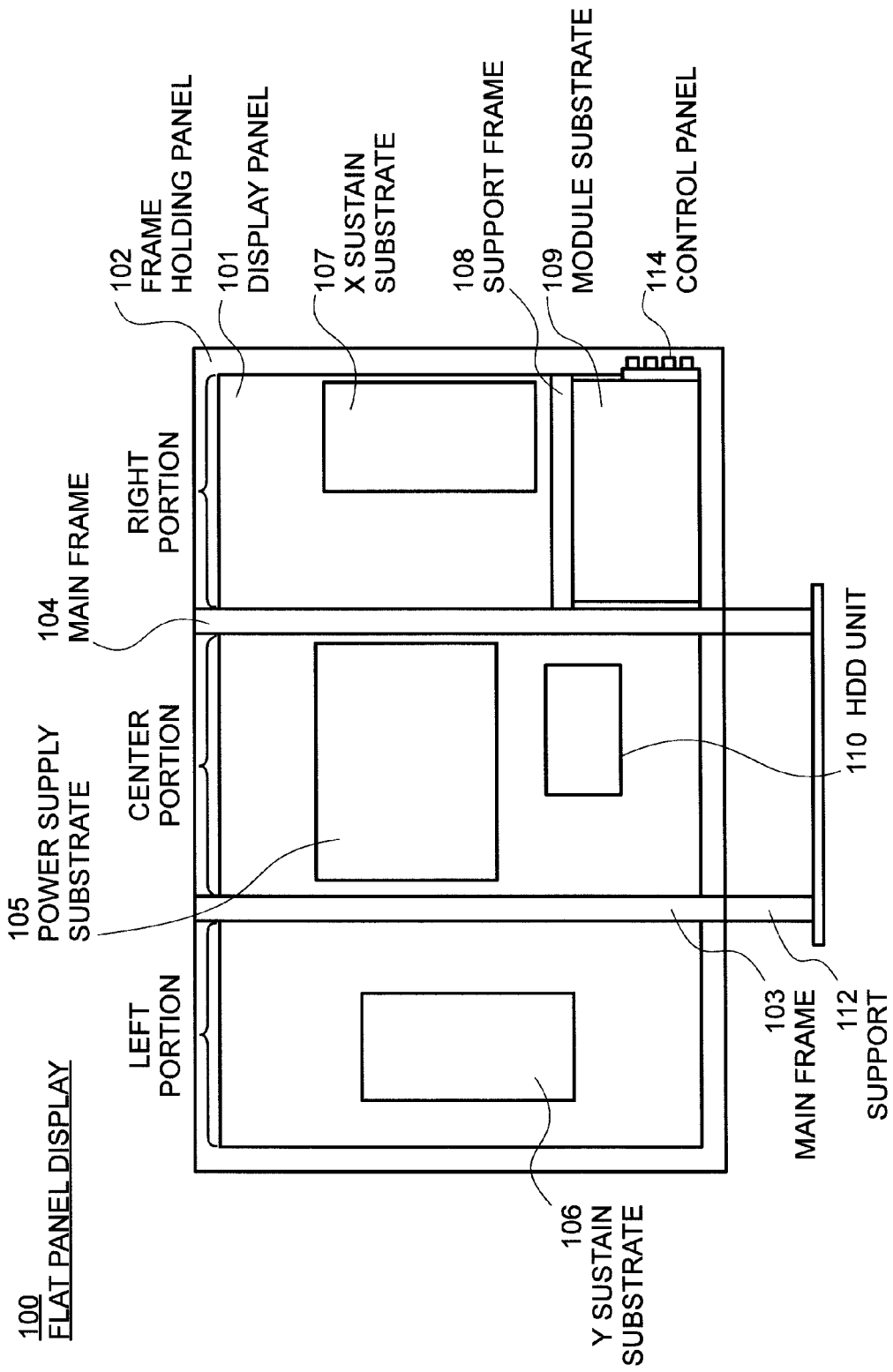
FIG. 1 is a rear view of one embodiment of a flat panel display according to the present invention.

The embodiment of the present invention is described below with reference to the accompanied drawings. In each drawing, composing elements having common functions are given the same reference numerals and duplicate descriptions thereof are omitted.

Figure 2:
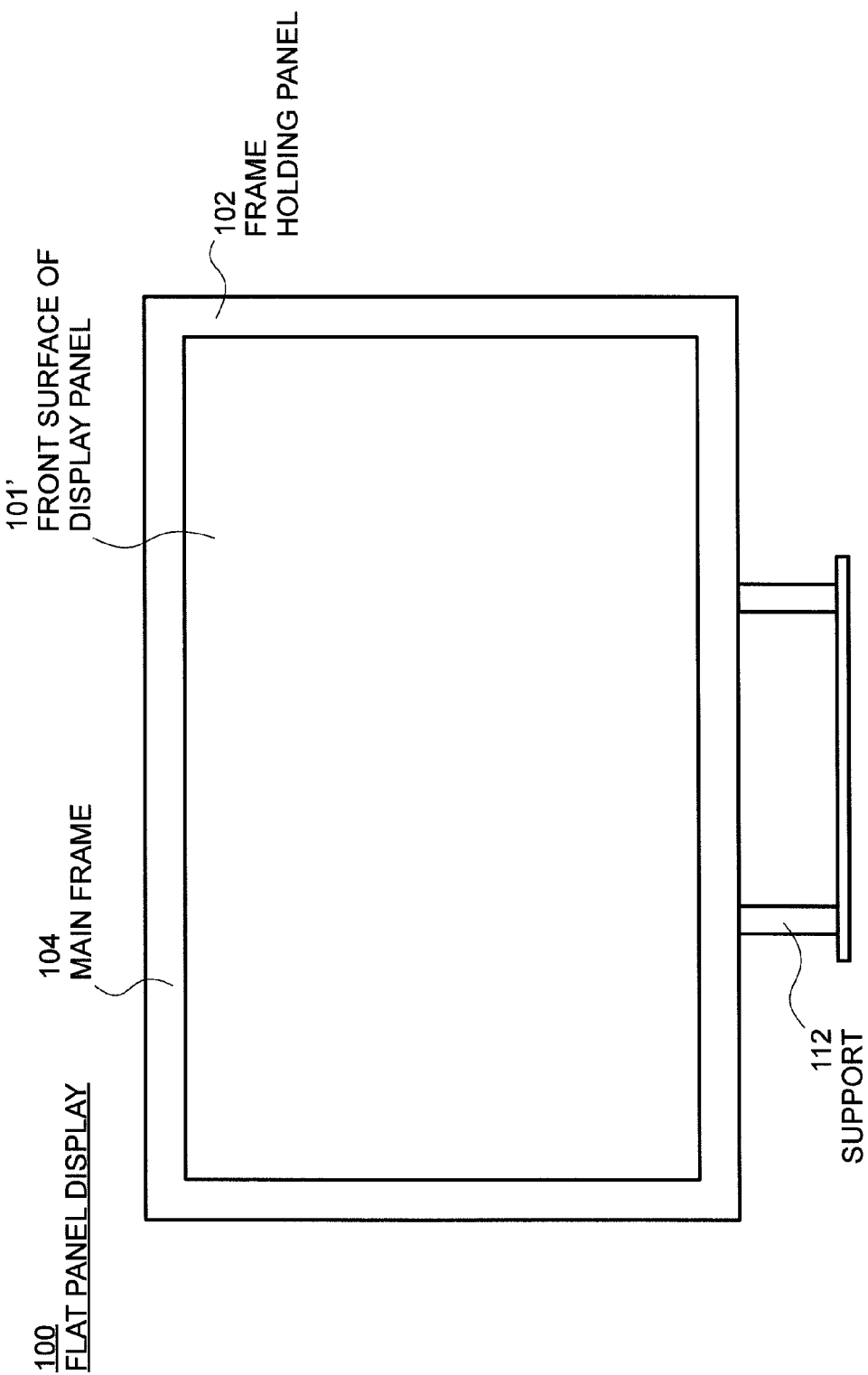
FIG. 2 is a front view of one embodiment of the flat panel display according to the present invention.
Figure 3:
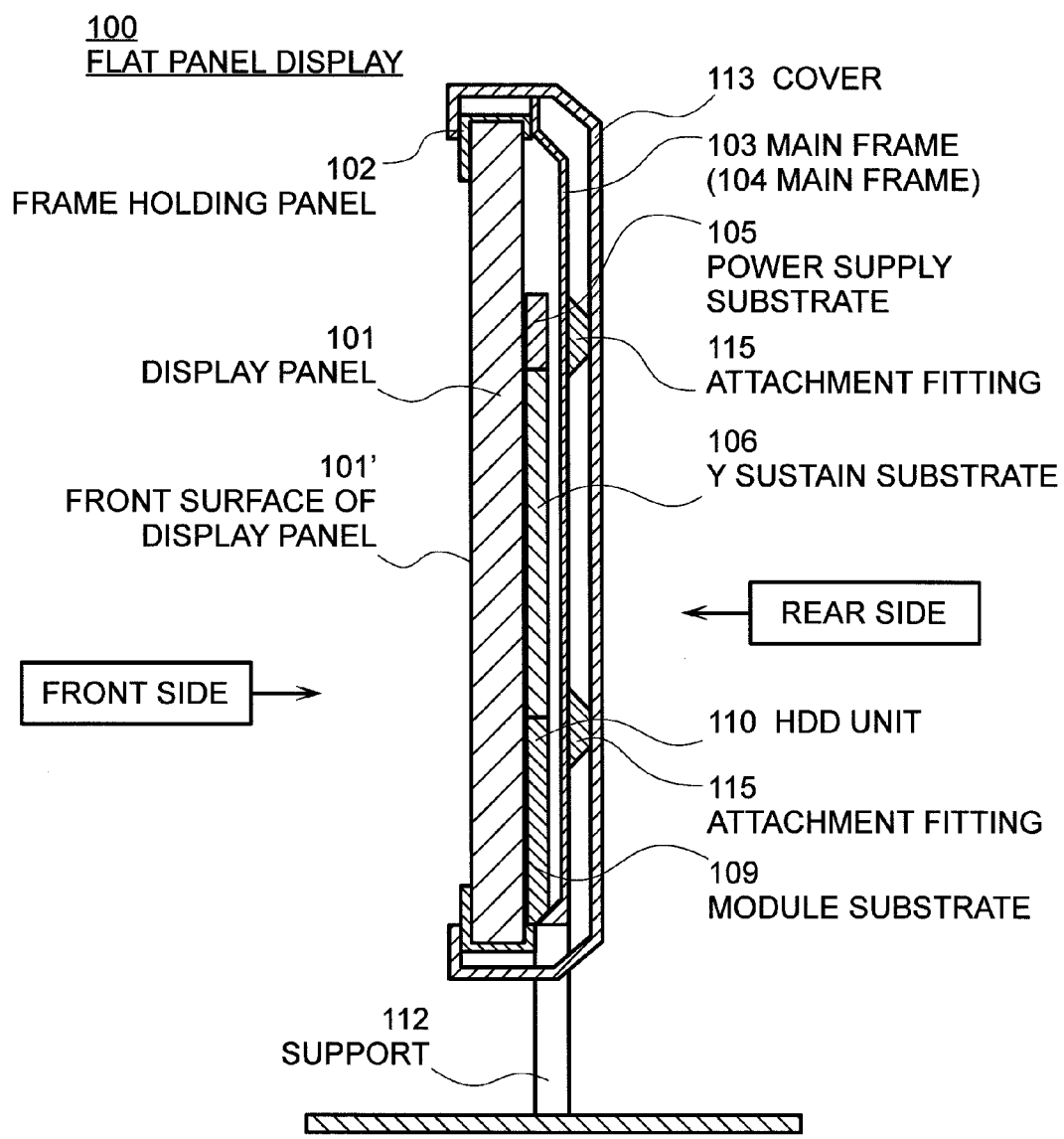
FIG. 3 is a schematic cross section illustrating side elevation of one embodiment of the flat panel display according to the present invention.
Figure 4:
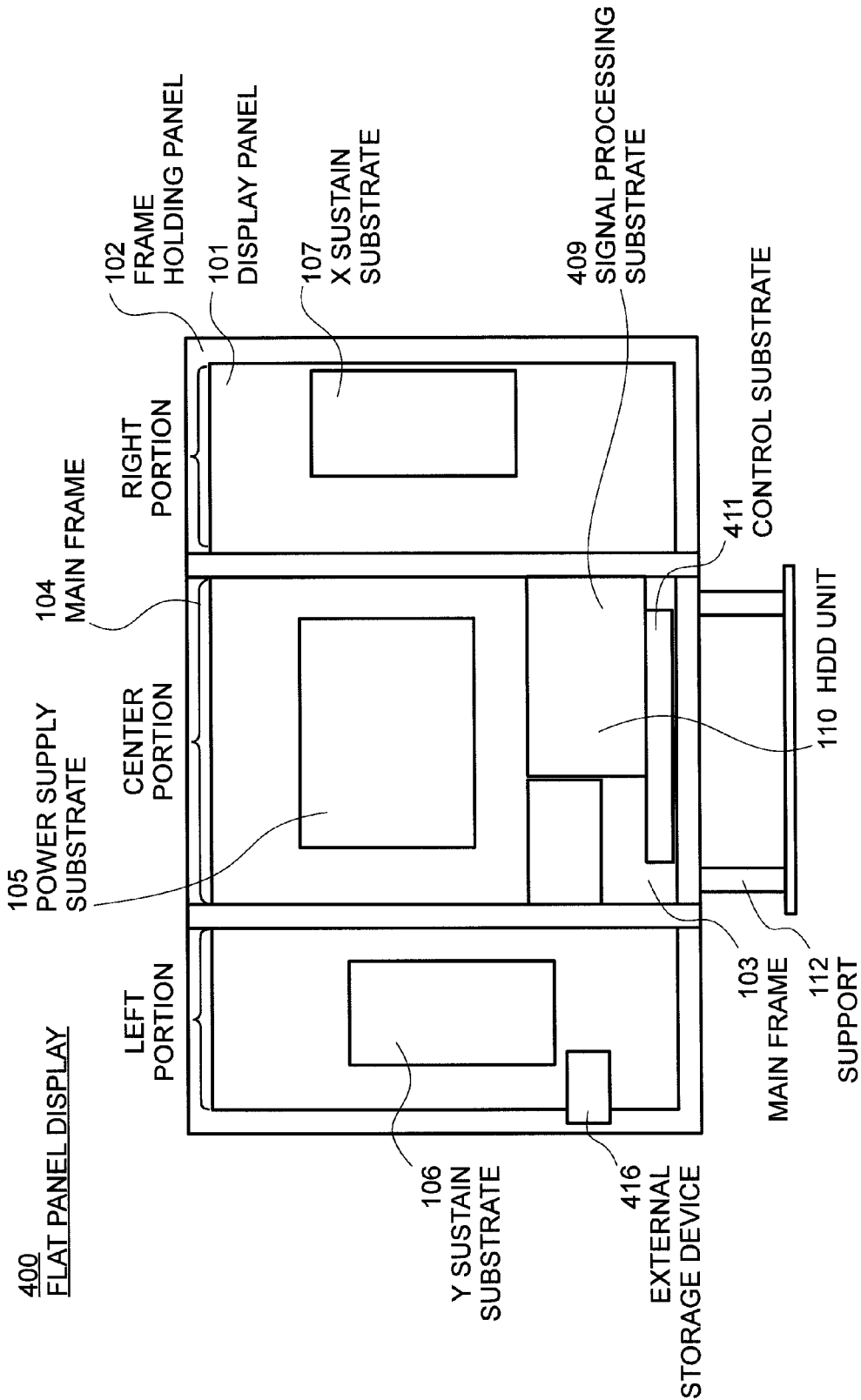
FIG. 4 is a rear view of one embodiment of a flat panel display.
Figure 5:
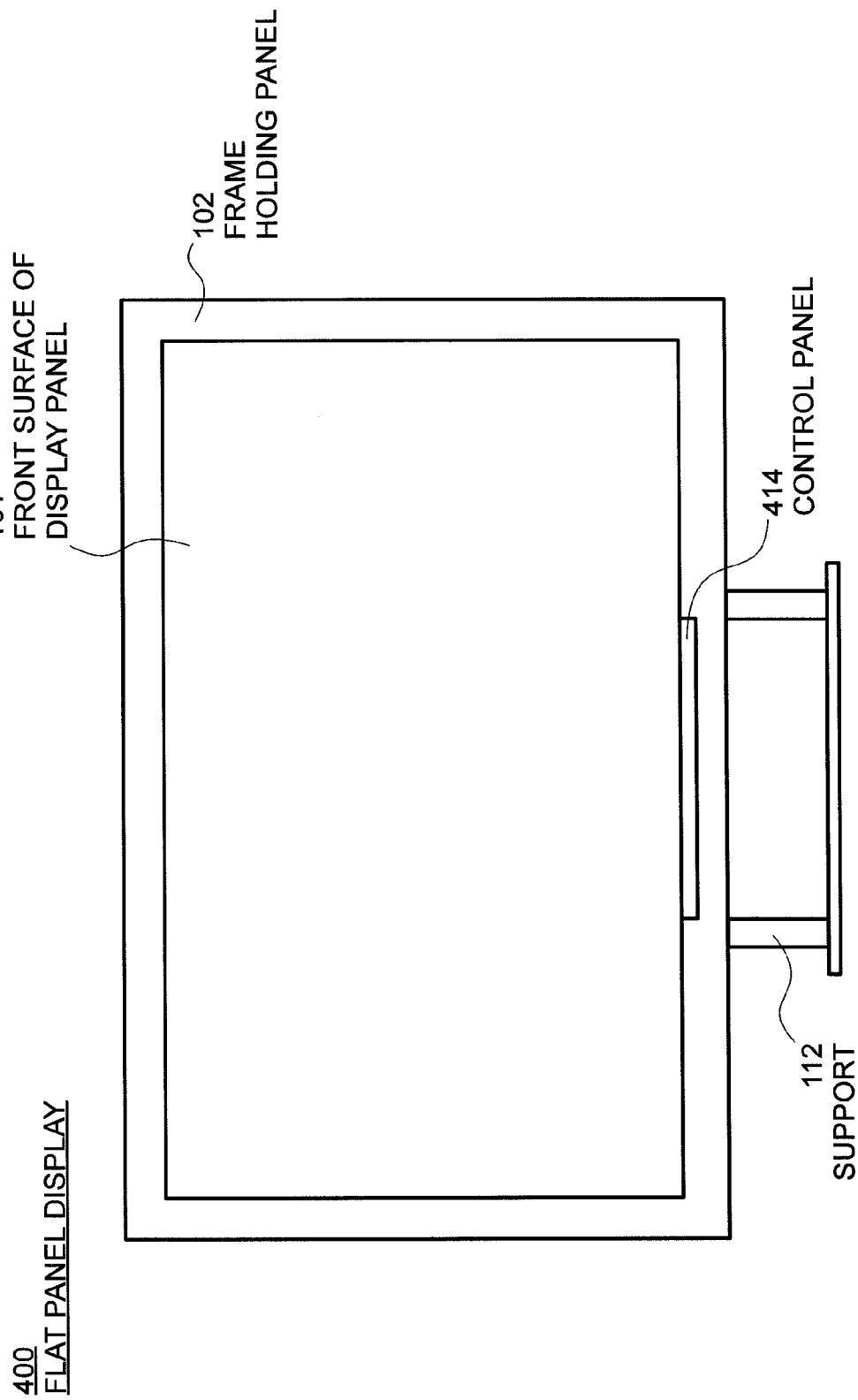
FIG. 5 is a front view of one embodiment of a flat panel display.
Figure 6:
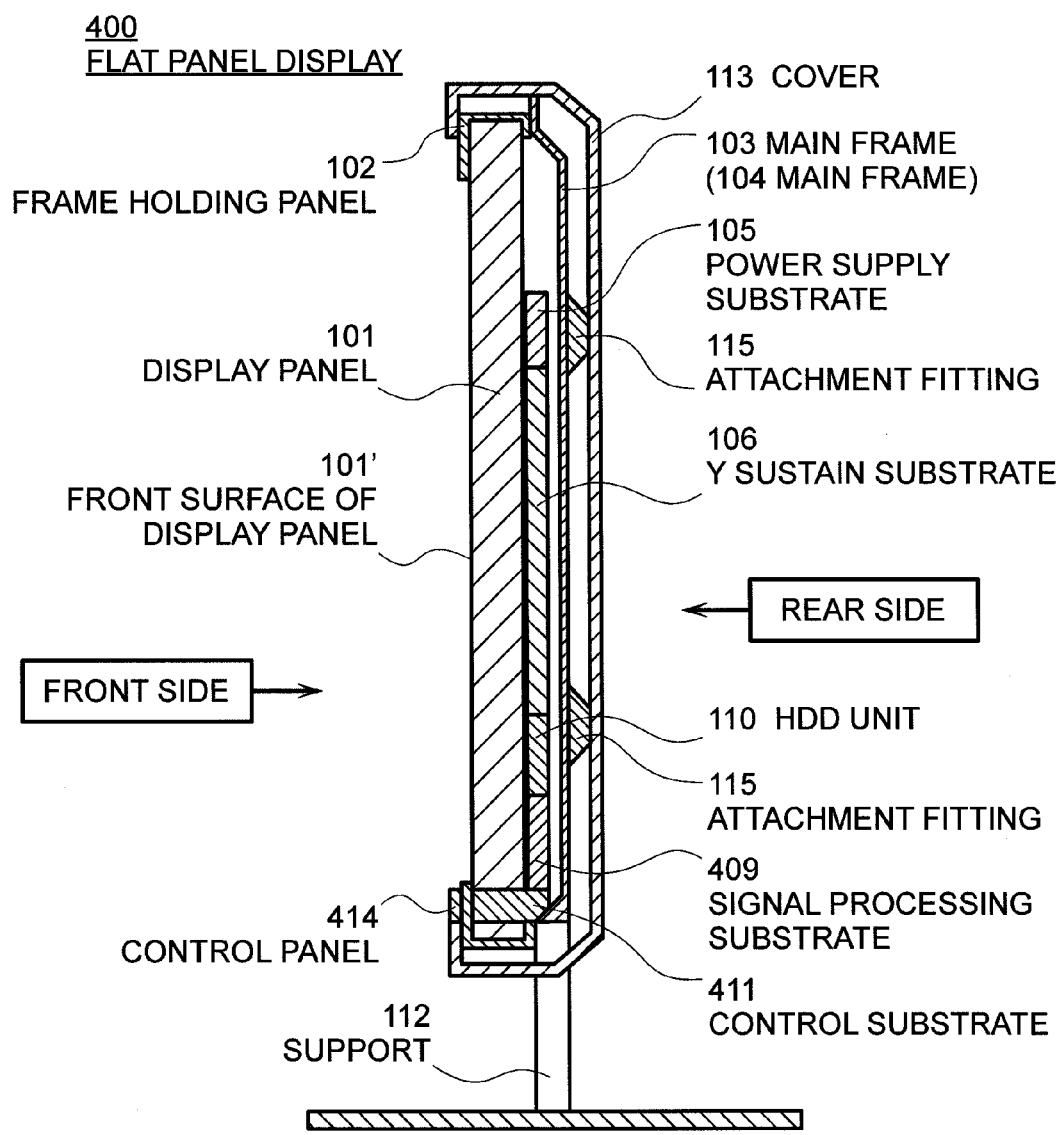
FIG. 6 is a schematic cross section illustrating a side configuration of one embodiment of a flat panel display.

FIGS. 1 to 6 are diagrams illustrating the configuration of a flat panel display with the PDP as a display device. FIGS. 4 to 6 are diagrams illustrating a configuration inferior in heat radiation. FIGS. 1 to 3 are diagrams illustrating an arrangement in which heat radiation is improved.

FIG. 4 is a rear view of the flat panel display with its cover removed. FIG. 5 is a front view of the flat panel display illustrated in FIG. 4. FIG. 6 is a schematic cross section viewed from the side of the flat panel display illustrated in FIG. 4. Reference numeral 400 denotes a flat panel display; reference numeral 101 denotes a display panel such as a PDP display device; reference numeral 102 denotes a frame holding the panel; and reference numerals 103 and 104 denote main frames attached to the frame and reinforcing them in the vertical direction as beams. The main frames 103 and 104 divide the back of the panel 101 into the left portion, the center portion and the right portion in the horizontal direction.

Reference numeral 105 denotes a power supply substrate mounted in the center portion at the back of the display panel 101; reference numeral 106 denotes a Y sustaining substrate mounted in the left portion at the back of the display panel 101; reference numeral 107 denotes an X sustaining substrate mounted in the right portion at the back of the display panel 101; reference numeral 409 denotes a signal processing substrate mounted in the center portion at the back of the display panel 101 and in the lower portion of the power supply substrate 105; reference numeral 110 denotes a hard disk drive (HDD) unit mounted in the center portion at the back of the display panel 101 and in the lower portion of the power supply substrate 105; reference numeral 411 denotes a control substrate mounted in the lower portion of the power supply substrate 105 and the signal processing substrate 409 in the center portion at the back of the display panel 101; reference numeral 112 denotes a support on which a flat panel display 400 is rested; reference numeral 101' denotes a front surface of the display panel displaying an image which a user views; reference numeral 414 denotes a control panel on the front surface of the display panel 101' whereby the user operates the flat panel display 100; reference numeral 416 denotes an external storage device which records or reproduces removal media inserted into a slot and is mounted in the lower portion of the power supply substrate 105 and the signal processing substrate 409 in the center portion at the back of the display panel 101; reference numeral 413 denotes a cover for protecting the flat panel display 100; and reference numeral 115 denotes an attachment fitting for attaching the cover 413 to the main frames 103 and 104.

The HDD unit 110 does not always particularly need to be the HDD, but may be other storage devices, or may not be mounted. The external storage device 416 is a digital versatile disk (DVD) or a semiconductor memory recording device and may not be mounted.

In FIGS. 4 to 6, wiring cables for electrically connecting the substrates together are omitted from illustration for the sake of simplicity. Mechanically attaching, mounting, fixing and holding screws and screw holes are also omitted from illustration for the sake of simplicity. Plural heat radiating fins for directly radiating heat from heat generating elements such as a power transistor and a central processing unit (CPU) is attached to the power supply substrate 105, the Y sustaining substrate 106, the X sustaining substrate 107 and the signal processing substrate 409. Similarly to the above, the above fins are omitted because the fins are positioned over the substrates in the rear view of the flat panel display 400 in FIG. 4 and because the illustration of the fins in the schematic cross section in FIG. 6 makes it difficult to discriminate them from the other composing elements. Forced-cooling blower fans are mounted in spots but are omitted from illustration for the sake of simplicity.

In FIGS. 4 to 6, at the upper and the lower portion of the cover 413, there are made vent holes for ventilating air for heat radiation. Even when the blower fans are not operated, air heated in the flat panel display 400 escapes from the vent hole at the upper portion of the cover 413 and air is supplied from that of the lower portion thereof.

The signal processing substrate 409 and the HDD unit 110 are mounted underlie the power supply substrate 105 which is the greatest in heating value and the control substrate 411 is mounted under the signal processing substrate 409 and the HDD unit 110. The control substrate 411, in particular, interrupts the vent hole made in the lower central portion of the cover 413. For this reason, the vent hole is weak in air-intake force, requiring a forced cooling with the aid of a blower fan (not shown). Between the substrates, there are laid a large number of wiring cables (not shown) in the horizontal direction. The wiring cables prevent air from ventilating, thereby sufficient heat radiation cannot be obtained.

Similarly, the external storage device 416 mounted under the Y sustaining substrate 106 which is the second greatest in heating interferes with a cooling channel.

Thus, the substrates, the unit and storage device are separately arranged, so that the cables connecting them are long and the number thereof is great. This interferes with the cooling channels and may deteriorate characteristics of the flat panel display by electromagnetic induction generated if current flows. For this reason, there are provided an electromagnetic shield or ferrite to take a countermeasure against electromagnetic interference (EMI). Providing such an electromagnetic shield or ferrite interferes with the heat radiating channels and leads to increase in production cost.

The configuration of such a flat panel display as described in FIGS. 4 to 6 can hardly produce a good effect in terms of heat radiation and magnetic shield. Then, one embodiment of the present invention as a modification thereof is described below with reference to FIGS. 1 to 3.

FIG. 1 is a rear view the flat panel display with its cover removed. FIG. 2 is a front view of the flat panel display illustrated in FIG. 1. FIG. 3 is a schematic cross section viewed from the side of the flat panel display illustrated in FIG. 1.

Reference numeral 100 denotes a flat panel display. Reference numeral 108 denotes a support frame being a horizontal beam spanning between the frame 102 and the main frame 104 in the right portion at the back of the display panel 101; reference numeral 109 denotes a module substrate incorporating the signal processing substrate, control substrate and external storage device supported by the support frame 108, main frame 104 and frame 102 and mounted; reference numeral 113 denotes a cover; and reference numeral 114 denotes a control panel attached near the module substrate 109. The control panel 114 is attached to the right face which cannot be illustrated in FIG. 3 and contacts the module substrate 109. The HDD unit 110 does not always particularly need to be the HDD, but may be other storage devices, or may not be mounted. The signal processing substrate 109 subjects a video signal displayed on the display panel 101 to various signal processing such as, for example, contrast correction process, color correction process, frame rate conversion and interlace-to-progressive scanning conversion.

In FIGS. 1 to 3, wiring cables for electrically connecting the substrates together are omitted from illustration for the sake of simplicity. Mechanically attaching, mounting, fixing and holding screws and screw holes are also omitted from illustration for the sake of simplicity. Plural heat radiating fins for directly radiating heat from heat generating elements such as a power transistor and a central processing unit (CPU) are attached to the power supply substrate 105, the Y sustaining substrate 106 being a first driving substrate for driving the display panel 101, the X sustaining substrate 107 being a second driving substrate for driving the display panel 101 and the module substrate 109. Similarly to the above, the above fins are omitted because the fins are positioned over the substrates in the rear view of the flat panel display 100 in FIG. 1 and because the illustration of the fins in the schematic cross section in FIG. 3 makes it difficult to discriminate them from the other composing elements. Forced-cooling blower fans are not mounted in the present embodiment.

In FIGS. 1 to 3, at the upper and the lower portion of the cover 113, there are made vent holes for ventilating air for heat radiation. Air heated in the flat panel display 100 escapes from the vent hole at the upper portion of the cover 113 and air is supplied from that of the lower portion thereof.

In the present embodiment, as is clear from the figure, the power supply substrate 105 which is the greatest in heating value generation and generates a power supply voltage (supplied to the Y sustaining substrate 106, the X sustaining substrate 107 and the signal processing substrate 109) for operating the display panel 101 is arranged in the center portion at the back the display panel 101. Aside from the HDD unit 110, there are not arranged such a substrate, projection and shielding as interfere with a cooling or heat-radiating channel under the power supply substrate 105. In the conventional art described, for example, in Japanese Patent Application Laid-Open No. 2000-156581, the signal processing substrate and the like are arranged under the power supply substrate. The power supply substrate and the signal processing substrate are arranged side by side in the upper and the lower portion at the center of the display panel respectively. In the present embodiment, however, the signal processing substrate 109 is arranged at one of the left and the right in the horizontal direction of the display panel 101 instead of at the center of the display panel 101 and in a position where the signal processing substrate 109 does not overlap with the power supply substrate 105 in the vertical direction of the display panel 101. In other words, the signal processing substrate 109 is arranged outside the area enclosed by the straight lines in which the left- and the right-hand side of the power supply substrate are extended in the vertical direction. Air entering the flat panel display 100 from the center lower portion thereof smoothly flows toward the power supply substrate 105 as cooling air without going through the signal processing substrate 109 (that is to say, the signal processing substrate 109 does not interfere with or disturb the air) to efficiently radiate heat. Furthermore, the signal processing substrate, control substrate and external storage device are incorporated in the module substrate 109 to reduce the number of cables connecting the above components together and of cables laid under the power supply substrate 105, causing smooth cooling air to flow, which radiates heat around the power supply substrate 105. Still furthermore, reduction in the number of cables and in the length thereof enables preventing the deterioration of characteristics of the flat panel display 100 due to electromagnetic induction. The electromagnetic shield and ferrite for considering EMI regulation can be reduced in number as much as possible to allow reduction in production cost.

In the present embodiment, the signal processing substrate 109 is arranged on the side opposite to the Y sustaining substrate 106 comparatively greater in heating Value than the X sustaining substrate 107, i.e., under the X sustaining substrate 107. This enables the signal processing substrate 109 to be protected thermally from the Y sustaining substrate 106 and cooling air entering from the lower portion of the flat panel display 100 to flow toward the Y sustaining substrate 106 without the interference of the signal processing substrate 109. Since a large number of fins is provided on the Y sustaining substrate 106 because it is comparatively greater in heating Value and since the Y sustaining substrate 106 is larger in a circuit area than the X sustaining substrate 107, the signal processing substrate 109 is arranged on the side of the X sustaining substrate 107 where the signal processing substrate 109 can be easily arranged in terms of space.

A circuit other than the signal processing substrate 109 may be arranged under the X sustaining substrate 107. For example, a slot into which a recording medium such as a removable HDD is inserted and a removable HDD controlling substrate for controlling writing a video signal into and reading it from the recording medium may be stacked on the signal processing substrate 109 (more specifically, they may be stacked in the direction orthogonal to the principal plane of the display panel 101). It is needless to say that other circuit substrates may be stacked on the signal processing substrate 109 and the removable HDD controlling substrate.

Figure 7:
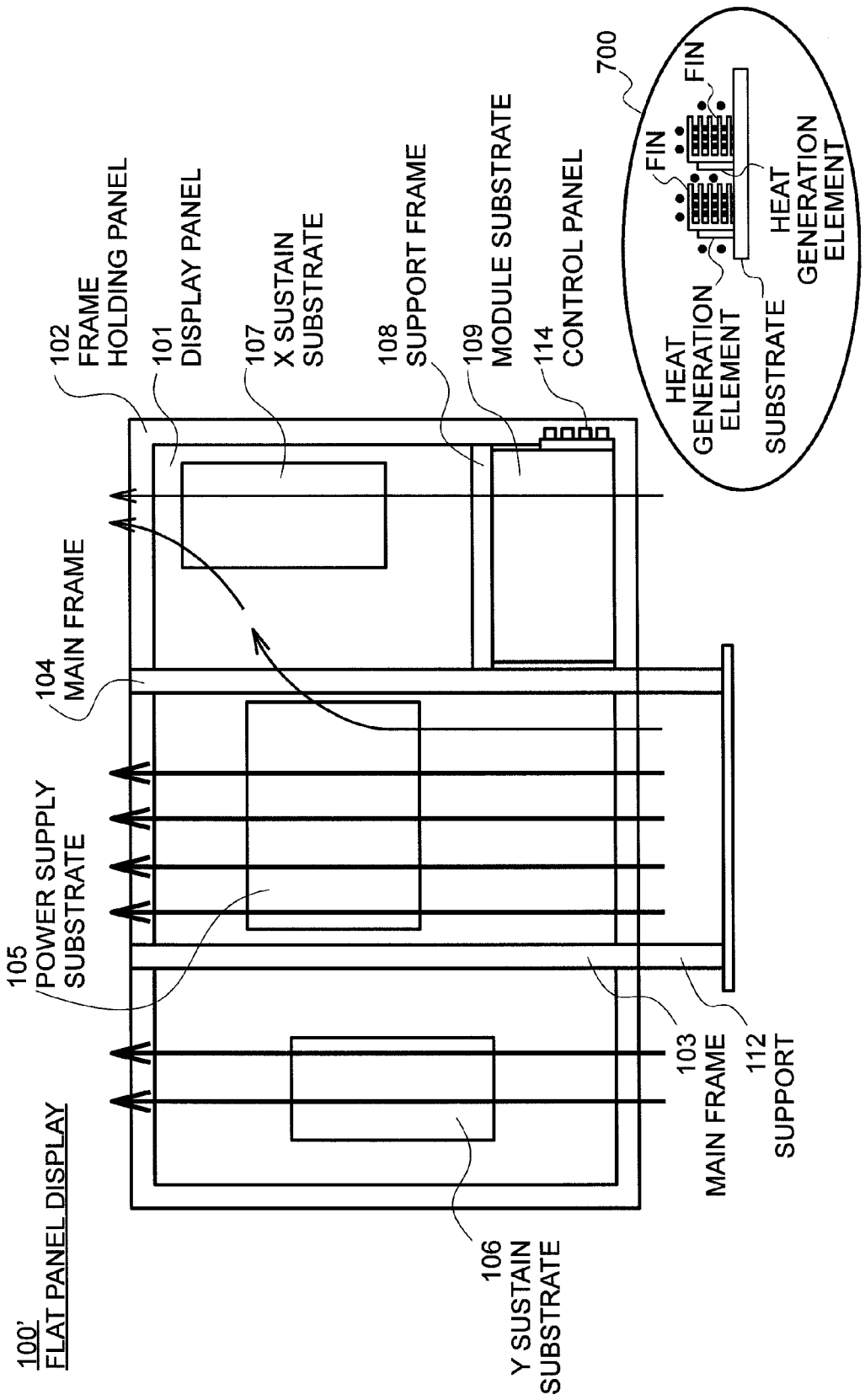
FIG. 7 is a schematic diagram describing one embodiment of flow of cooling air in the rear face of the flat panel display according to the present invention.

FIG. 7 is a schematic diagram describing a channel for cooling air in the flat panel display 400' without the HDD unit 410 in the configuration of the embodiments in FIGS. 1 to 3. Plural air intakes (not shown) are provided at the lower portion of the cover 113 and plural air outlets (not shown) are provided at the upper portion thereof. The channel is indicated by an arrow. The thicker the arrow is, the higher the air flow rate is. The larger the number of the arrows, the higher the air flow rate. Also in the present embodiment, the signal processing substrate 109 is arranged under the lower portion of the X sustaining substrate 107 and in a position where the signal processing substrate 109 does not overlap with the power supply substrate 105 in the vertical direction of the display panel 101.

As illustrated in FIG. 7, air flowing though cooling fins (not shown) at the upper portion (on this side of the paper surface) of the power supply substrate 105 is the highest in flow rate.

A figure enclosed by a circle 700 in FIG. 7 is a schematic cross-section top or bottom view of a substrate. Heat generating elements such as power transistors are mounted on the cooling fins in FIG. 7 and air passing through between the cooling fins in the direction of the black circle. The black circle is a cross section of the arrow in FIG. 7.

In the present embodiment, the Y sustaining substrate and the X sustaining substrate are mounted on the left and the right portion respectively. However, the left and the right are relative. It is needless to say that the Y and the X sustaining substrate may be mounted on the right and the left portion respectively.

Figure 8:
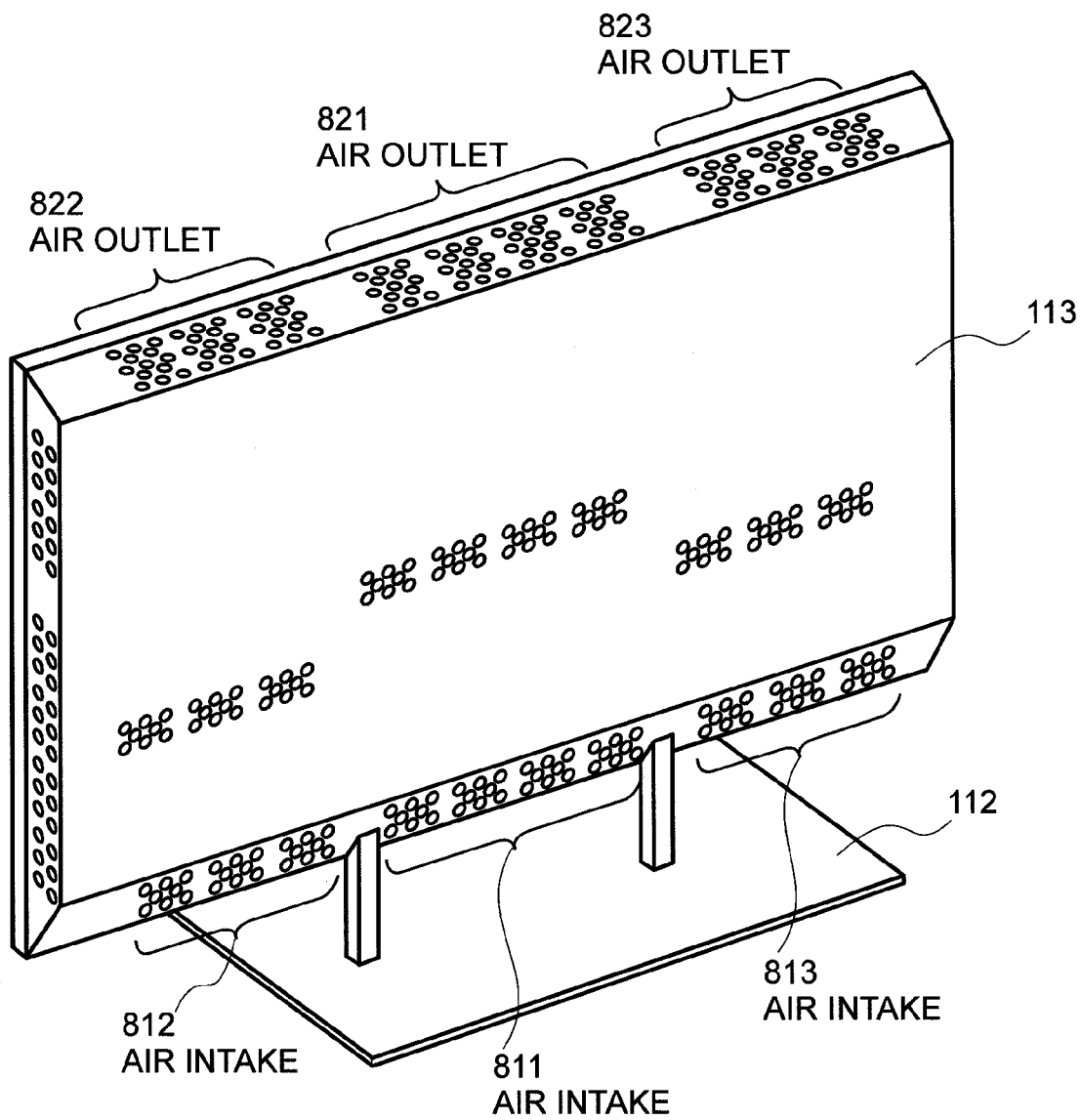
FIG. 8 is a schematic diagram describing one embodiment of air intake and air outlet provided on a cover of the flat panel display according to the present invention.

FIG. 8 is a schematic diagram describing one embodiment of the cover 113 used in the configuration of the embodiments in FIGS. 1 to 3. Countless circular vent holes are made on the entire face of the cover 113. In particular, air intakes 811, 812 and 813 are provided at the lower portion of the cover 113 and air outlets 821, 822 and 823 are provided at the upper portion thereof. Other than the above positions, vent holes are made to urge cooling air to circulate, improving a cooling performance.

In the embodiment in FIG. 8, plural circular holes are made, but any shape and size may be provided, and openings with different shape and size may be combined together. The flat panel display is provided with an opening used as a handle for carrying the display or for fixing. The opening may be used as a vent hole.

Figure 9:
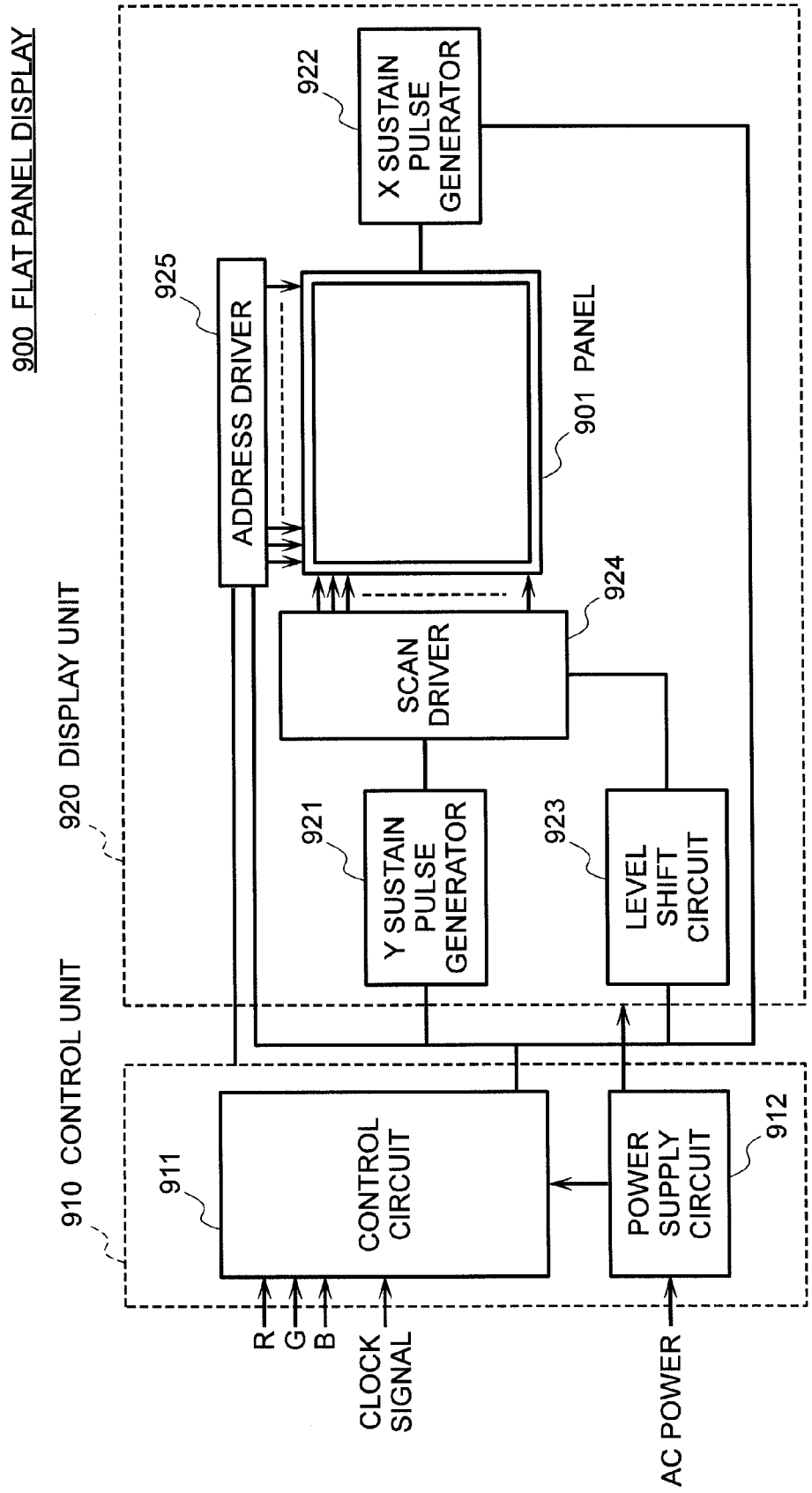
FIG. 9 is a schematic block diagram of a flat panel display.

FIG. 9 is a schematic block diagram of a flat panel display using a display device such as a PDP. Reference numeral 900 denotes a flat panel display using a display device (panel 901) such as a PDP; reference numeral 901 denotes a panel; reference numeral 910 denotes a control unit; reference numeral 920 denotes a display unit; reference numeral 911 denotes a control circuit; reference numeral 912 denotes a power supply circuit; reference numeral 921 denotes a Y sustain pulse generator; reference numeral 922 denotes an X sustain pulse generator; reference numeral 923 denotes a level shift circuit; reference numeral 924 denotes a scan driver; and reference numeral 925 denotes an address driver.

In FIG. 9, the scan driver 924 scans and drives all the Y electrodes of the panel 901 on a sub-field basis. The address driver 925 constructs an address pulse voltage whose timing corresponds to an image signal. An address electrode is driven by the address pulse voltage to address the display cell of the panel 901 on a sub-field basis. The X sustain pulse generator 922 generates a sustain pulse for driving the X electrode. The Y sustain pulse generator 921 generates a sustain pulse for driving the Y electrode. The level shift circuit 923 is a photocoupler. The control circuit 911 controls the Y sustain pulse generator 921, the X sustain pulse generator 922, the level shift circuit 923, the scan driver 924 and the address driver 925. The power supply circuit 912 is equipped with a DC/DC converter and supplies each composing element of the flat panel display 900 with power.

The composing elements in FIG. 9 can be associated with those in FIG. 1 as follows: the display panel 901 is associated with the display panel 101; the control circuit 911 with the module substrate 109; the power supply circuit 912 with the power supply substrate 105; the Y sustain pulse generator 921 with the Y sustaining substrate 106; the X sustain pulse generator 922 with the X sustaining substrate 107; and the level shift circuit 923 with the Y sustaining substrate 106. The scan driver 924 and the address driver 925 are not illustrated in FIG. 1.

FIG. 10 is a diagram illustrating a rear view of FIG. 1 to which the scan driver 924 and the address driver 925 are added. As illustrated in FIG. 10, the scan drivers 1001 and 1002 are mounted on both sides of display panel 101 and the address driver 1003 is mounted at the lower portion thereof.

As described above, the embodiment enables constructing such a structure as to cause cooling air to easily flow thereinto even in a flat panel display whose consumption power increased due to increase in its size or even in a flat panel display whose structure hardly employs a heat radiating channel because the display is thinned, so that heat can be effectively radiated.

The signal processing circuit and other substrates are incorporated into the same substrate, so that cable wirings between the substrates are shortened or laid on the substrate, which decreases the number and the length of cable wirings. This increases available space to easily secure channels for heat radiation.

Electromagnetic induction can be less generated to allow reduction in consumption power and improvement in functions of the display device.

What is claimed is:

1. A flat panel display apparatus, comprising:
a plasma display panel;
a power supply substrate constructing a power supply for operating the plasma display panel;
a signal processing substrate being connected with a control panel to operate the apparatus and processing a video signal displayed on the plasma display panel;
to a Y sustaining substrate for driving the plasma display panel;
an X sustaining substrate for driving the plasma display panel;
wherein the power supply substrate, the signal processing substrate, the Y sustaining substrate and the X sustaining substrate are arranged at a back of the plasma display panel;
when viewing the plasma display panel from the back thereof, the power supply substrate is arranged at a center portion of the plasma display panel, the Y sustaining substrate is arranged at one of a left side and a right side of the plasma display panel, the X sustaining substrate is arranged at the other of the left side and the right side, and the signal processing substrate is arranged under the X sustaining substrate; and
a circuit substrate other than the power supply substrate, the Y sustaining substrate, and the X sustaining substrate is arranged under the power supply substrate.

2. The flat panel display apparatus according to claim 1, wherein the other circuit substrate is a HDD unit.

3. The flat panel display apparatus according to claim 1, wherein air entering the flat panel display from a center lower portion of the flat panel display is supplied to the power supply substrate without going though the signal processing substrate.

4. The flat panel display apparatus according to claim 1, wherein an address driver is mounted in a lower portion at the back of the plasma display panel.

5. A flat panel display apparatus, comprising:
a plasma display panel;
a power supply substrate constructing a power supply for operating the plasma display panel;
a processing substrate having a central processing unit,
a Y sustaining substrate and an X sustaining substrate for driving the plasma display panel;
wherein the power supply substrate, the processing substrate, the Y sustaining substrate and the X sustaining substrate are arranged at a back of the plasma display panel;
when viewing the plasma display panel from the back thereof, the power supply substrate is arranged at a center portion of the plasma display panel, the Y sustaining substrate is arranged at one of a left side and a right side of the plasma display panel, the X sustaining substrate is arranged at an other of the left side and the right side, and the processing substrate is arranged under the X sustaining substrate.

6. The flat panel display according to claim 5, wherein an address driver is mounted in a lower portion at the back of the plasma display panel.

7. The flat panel display according to claim 5, wherein scan drivers are mounted on both of the left and right sides at the back of the plasma display panel.

* * * * *